United States Patent [19]

Woolling, Jr.

[11] 3,961,281

[45] June 1, 1976

[54] DIGITAL CONTROL SYSTEM

[75] Inventor: Kenneth Rau Woolling, Jr., Indianapolis, Ind.

[73] Assignee: RCA Corporation, New York, N.Y.

[22] Filed: May 23, 1975

[21] Appl. No.: 580,680

[52] U.S. Cl. .............................. 330/129; 328/168; 330/29
[51] Int. Cl.² ........................................ H03G 3/00
[58] Field of Search ............... 330/29, 86, 127–129; 328/168, 173

[56] References Cited
UNITED STATES PATENTS 3,579,138  5/1971  Harris et al. ......................... 330/86

*Primary Examiner*—James B. Mullins
*Attorney, Agent, or Firm*—Eugene M. Whitacre

[57] ABSTRACT

Remote control signals actuate digital circuitry suitable for controlling the volume of an audio amplifier. A digital counter either increases or decreases in count corresponding to a desired volume control level. Circuitry associated with the counter causes an audio amplifier control voltage derived therefrom to increase at a first rate of change in response to a predetermined range of counter output and at a second rate of change corresponding to a second predetermined range of counter output.

4 Claims, 3 Drawing Figures

DIGITAL CONTROL SYSTEM

This invention relates to control systems and, more particularly, to a digital system suitable for remote control of electronic circuitry.

Electronic equipment, such as, radio and television receivers, generally incorporate controls for adjusting particular functions, such as, picture or sound volume. Such control functions, particularly when operated by remote control means, are desirably all electronic. That is, the associated function controlling device is entirely electrical and free from electromechanical parts, such as, motors and the like. One type of electronic control system which may be operated remotely incorporates a clock signal generator coupled to a digital counting circuit. Function increase commands are then accomplished by coupling the clock signal generator to the electronic counter and causing this counter to count up to a number corresponding to a desired control condition; e.g., desired volume level. Similarly, control signals corresponding to a function decrease may be initiated for causing the counter to count in a decreasing direction to a desired function level. A digital-to-analog voltage converter is coupled to the counter and provides an output voltage corresponding to the numerical count provided by the counter. A relatively linear output signal is generally provided from the digital-to-analog converter in response to the numerical count.

If, for example, the counter in the above-described circuit has 16 different states, the function controlled by this counter may be subdivided into 16 increments of control. As described above, the output control voltage provided from the D/A converter is relatively linear with respect to numerical count. In some control systems, for example, volume control of an audio amplifier, it is desirable to provide a greater range of control over one particular portion of the control range than another. Illustratively, it is desirable to provide large increments of volume change in the range of relatively low audio output signals and correspondingly desirable to provide relatively small increments of volume increase in the region of relatively high audio level output where audio volume changes may be subjectively more apparent. It is therefore desirable to provide a digital control system in which a rapid incremental control change occurs over one portion of control and a smaller incremental control change over another portion of control.

Apparatus which provides a dual rate of change in control and is suitable for use with an electronic remote control system comprises a receiver which is responsive to the remotely controlled transmitted signals for providing actuating signals. A pulse generating means is responsive to the actuating signals and provides a series of output pulses. A counting means is responsive to the pulses from the generating means and provides numerical representative binary output signals. An analog voltage generating means is responsive to signals from the pulse responsive means and provides an output voltage level representative of the binary coded signals. A means is responsive to the output voltage level of the analog voltage generator means for providing a modified output voltage having a first rate of change responsive to the numerical representative signals for output voltage levels of a first voltage range and a second rate of change with respect to the numerical representative signals for output voltage levels of a second voltage range.

A better understanding of this invention may be derived with reference to the following description when taken with the drawings of which:

Figure 1:
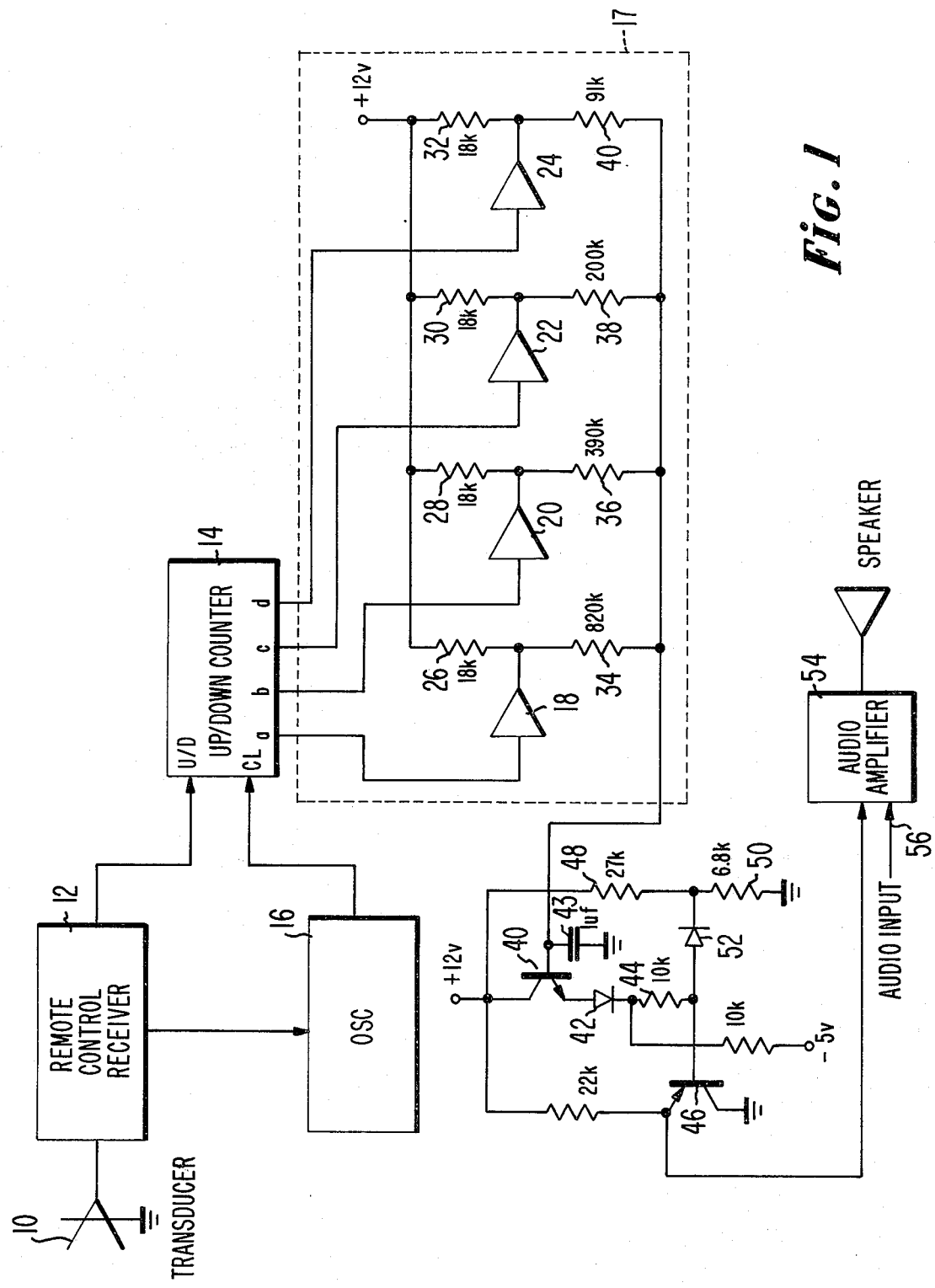
FIG. 1 is a partial block and schematic diagram of a digital volume control in accordance with the present invention.

With reference to FIG. 1, a transistor transducer 10 receives continuous wave ultrasonic remote control signals and couples these signals to a remote control receiver 12. Each function to be controlled is represented, for example, by a signal of a different frequency. Receiver 12 is arranged to decode or identify the particular frequency of the received signal and to couple control signals to actuate both a counter 14 and an oscillator 16. Oscillator 16 is further coupled to counter 14 and provides substantially fixed frequency clock signals thereto. Binary signal output terminals $a$, $b$, $c$ and $d$ of counter 14 are coupled to digital-to-analog converter 17. Converter 17 has a plurality of buffer amplifiers 18, 20, 22 and 24 each having input terminals respectively coupled to terminals $a$, $b$, $c$ and $d$ of counter 14. A supply voltage for the digital-to-analog converter is provided by the commonly coupled resistors 26, 28, 30 and 32 which are coupled between a source of positive supply voltage and respectively coupled to output terminals of amplifiers 18, 20, 22 and 24. The output terminals of amplifiers 18, 20, 22 and 24 are further respectively coupled to resistors 34, 36, 38 and 40 which provide at a common connection analog voltage representations of the binary digital signals applied to the input terminals of the D/A converter. The common connection of the aforementioned resistors is coupled to the base electrode of transistor 40. Transistor 40 provides current amplification to the applied base electrode signals and couples these amplified signals via an emitter electrode through the series combination of diode 42 and resistor 44 to the base electrode of a transistor 46. A voltage divider formed by resistors 48 and 50 is coupled to the base electrode of transistor 46 through a diode 52. Transistor 46 provides further current amplification to the signals applied at the associated base electrode and couples these signals through an emitter electrode to the control terminal of an audio amplifier 54. Amplifier 54 provides amplification to signals provided at its signal input terminal 56 in response to the control signals provided by transistor 46. Amplifier 54 may be an RCA type CA-3134 integrated circuit available from RCA Solid State Division, Somerville, New Jersey.

In the operation of the above-described circuit, a remote control transmitter, not shown, broadcasts one of a number of ultrasonic signals to receiving transducer 10. Receiver 12 senses the frequency of the transmitted ultrasonic signal and provides an output signal to one of a number of remote control functions. If the frequency received by receiver 12 corresponds to a volume increase command, a voltage corresponding, for example, to a logical zero, is applied to the U/D (up-down) input of counter 14 thereby causing counter 14 to count up. A volume decrease command would be represented by a logical one input in which case counter 14 would count down.

Enabling signals provided to oscillator 16 from receiver 12 cause this oscillator to couple a series of pulses to the clock input of counter 14. Oscillator 16 continues to provide such pulses until transducer 10 ceases receiving ultrasonic signals corresponding to volume change. Thus, in the volume increase mode of operation, counter 14 counts in the UP direction in response to receipt of clock signals from oscillator 16. Binary output signals representative of numerical digits are provided at terminals $a$, $b$, $c$ and $d$ of counter 14. For the numerical count of zero, output signals from terminals $a$, $b$, $c$ and $d$ are all logical zeros. For an output count of 15, the maximum count output, signals at terminals $a$, $b$, $c$ and $d$ are all logical ones. When the output of counter 14 corresponds to numerical zero; i.e., logical zeros at terminals $a$, $b$, $c$ and $d$, buffer amplifiers 18, 20, 22 and 24 of the digital-to-analog converter respectively couple resistors 34, 36, 38 and 40 to ground providing substantially zero volts to the base electrode of transistor 40. As counter 14 increases in count output, the voltage provided to the base electrode of transistor 40 increases. For example, when the output of counter 14 provides the numerical count of 3, a logical one signal is provided to the input of amplifiers 18 and 20. Resistors 34 and 36 are then respectively coupled through resistors 26 and 28 to a 12 volt source of supply voltage. The voltage derived at the common junction of resistors 34 and 36 is divided down by the commonly coupled resistors 38 and 40 which are coupled to ground through respective amplifiers 22 and 24. Transistor 40 has a base electrode coupled to the common junction of resistors 34–40 and is responsive to the voltage provided at this junction. As the numerical count of counter 14 is increased to 15, the voltage provided to the base electrode of transistor 40 correspondingly increases.

Resistors 34, 36, 38 and 40 are arranged in decreasing values of resistance, such that each of the respective resistors is approximately one-half that of the preceding resistor. By arranging these resistors in this manner, an approximately monotonically increasing output voltage may be derived for increasing numerical values of binary output signals from counter 14.

Transistor 40 is arranged in an emitter follower configuration and operates to provide both isolation and current amplification in response to the signal voltages applied to the associated base electrode. A filter capacitor 43 is further coupled to the base electrode of transistor 40 for smoothing out base voltage changes responsive to changes in output count from counter 14. Signals provided at the emitter electrode of transistor 40 are coupled through diode 42 and resistor 44 to the base electrode of transistor 46. Diode 42 is utilized to provide about a 0.7 volt drop in the output signal level from transistor 40. This drop in voltage is utilized in order to bring the voltage at the emitter electrode of transistor 46 to about zero volts when the numerical count from counter 14 is 1 (0001 binary). An emitter voltage of zero volts for a numerical count of 1 is desirable for providing a maximum attenuation to the associated voltage controlled audio amplifier 54. The transfer characteristic of the emitter voltage of transistor 46 to numerical count number of counter 14 is illustrated in FIG. 3.

Figure 3:
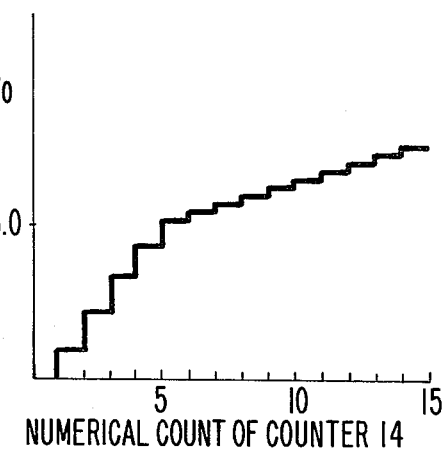
FIG. 3 is a representation of the output transfer function of the apparatus of FIG. 1.

With reference to FIG. 3, it may be seen that the emitter output voltage ($V_o$) from transistor 46 is provided at a first and second rate of change with respect to the numerical value of output count from counter 14. In the first sequence of counts between the counts of about 0 and 5, the output voltage from transistor 46 rises linearly from 0 to about 3.0 volts. Increased counts from 6 to 15 cause the emitter voltage of transistor 46 to rise at a slower rate. This second, slower rate is in conformance with a useful range of audio output level from audio amplifier 54 and is divided into a larger number of increments or counts. In one specific example of operation, amplifier 54 provides 75db of attenuation to audio input signals for a control voltage of 0 volts, 35db of attenuation for a control voltage of 3 volts and 0db of attenuation for a control voltage of 6 volts. To provide the breakpoint at step number 5, a voltage divider comprised of resistors 48 and 50 is arranged to provide an unloaded voltage of about 2.3 volts at their common junction. A diode 52 is coupled between this 2.3 volt junction and the base electrode of transistor 46. When the voltage supplied from transistor 40 to the base electrode of transistor 46 reaches the 3.0 volt level, diode 52 begins to conduct dividing any further voltage supplied by transistor 40. This voltage division causes the output voltage at the emitter of transistor 46 to rise at the slower rate of change shown in FIG. 3. Hence, by utilizing the diode breakpoint formed by diode 52 and the voltage divider of resistors 48 and 50, a desirable response curve can be formed in the audio control voltage. This desirable control response allows the audio amplifier to rapidly increase in volume over the first ⅓ of volume control range and then increase less rapidly over the remaining ⅔ volume change operating range. By incorporating the above-described second range, a finer adjustment of audio level may be achieved in the volume range which is most widely utilized.

Figure 2:
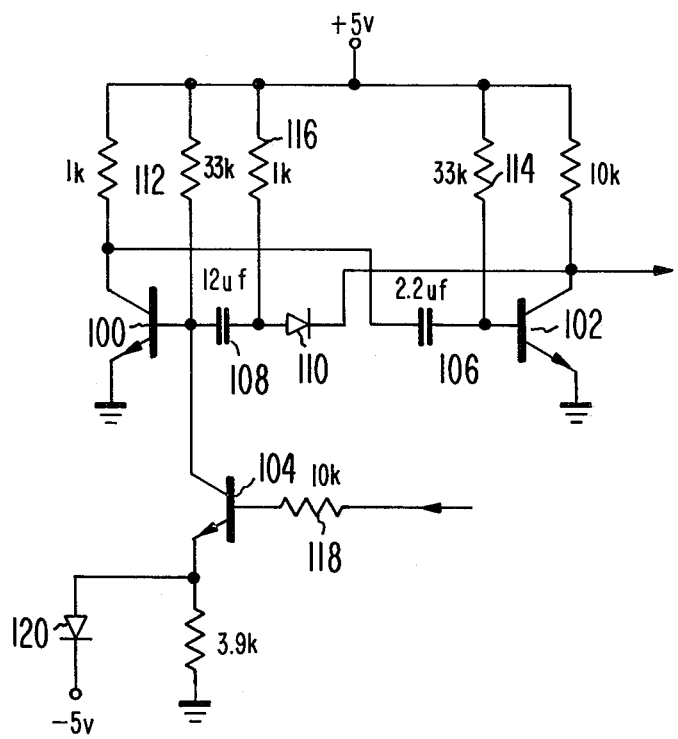
FIG. 2 is a schematic diagram of an oscillator suitable for use with the apparatus shown in FIG. 1.

In order to prevent fluctuation of the audio output level from, for example, extraneous ultrasonic noise signals which might cause counter 14 to count up or down, a turn-on time delay is incorporated in oscillator 16. Oscillator 16, as shown in FIG. 2, is comprised of a multivibrator having transistors 100 and 102 arranged in an astable configuration. A capacitor 106 is coupled from the base electrode of transistor 102 to the collector electrode of transistor 100, and a series combination of capacitor 108 and diode 110 is coupled between the base electrode of transistor 100 and the collector electrode of transistor 102. Pull-up resistors 112 and 114 are respectively coupled between a 5 volt supply terminal and base electrodes of transistors 100 and 102. An additional biasing resistor 116 is coupled between the 5 volt supply terminal and the junction of capacitor 108 and diode 110. A control transistor 104 has a collector electrode coupled to the base electrode of transistor 100 and receives control signals at an associated base electrode through a resistor 118. The emitter electrode of transistor 104 is coupled to a negative 5 volt supply terminal through a diode 120.

In the operation of the oscillator circuit shown in FIG. 2, control signals from, for example, the remote control receiver 12, are coupled to resistor 118 and operate to either turn on or off transistor 104. When transistor 104 is turned on; i.e., in saturation, the base electrode of transistor 100 is coupled through transistor 104 and diode 120 to a source of negative supply voltage. By coupling the base electrode of transistor 100 to this source of negative supply voltage, the multivibrator oscillator formed by transistors 100 and 102 is inhibited from oscillating. Transistor 104 is maintained in a saturated state in the absence of volume change command signals.

When a volume change command is received, a negative voltage is applied by receiver 12 to the base electrode of transistor 104 cutting this transistor off. When transistor 104 is cut off, the base electrode of transistor 100 remains momentarily at the negative supply voltage by virtue of the charge stored on capacitor 108. Capacitor 108 slowly discharges through resistor 112 until the voltage at the base of transistor 100 reaches approximately +0.6 volts. Transistor 100 then begins to conduct and astable multivibrator action occurs between transistors 100 and 102. The time delay incorporated within this multivibrator; i.e., the time required for capacitor 108 to discharge through resistor 112 to about +0.6 volts, is adjusted for a predetermined interval to insure that signals provided by receiver 12 to transistor 104 are transmitted control signals and not signals caused by extraneous noise.

Hence, in accordance with the above-described apparatus, a digitally controlled circuit suitable for providing amplitude control of an audio amplifier may be constructed with the desirable features of a rapid change in audio control over a first interval of digital control and a more gradual change in control over a second, more useful range of audio level control. Further, the associated oscillator circuit within the control system may incorporate a noise immunity feature preventing inadvertent operation of the digital circuitry in response to extraneous momentary signals.

What is claimed is:

1. Apparatus responsive to transmitted remote control signals for providing a control voltage suitable for controlling the gain of a voltage controlled amplifier comprising:

receiving means responsive to said transmitted control signals for providing actuating signals;

pulse generating means responsive to said actuating signals for providing a series of output pulses;

counting means responsive to pulses from said generating means for providing numerical representative binary coded output signals;

digital-to-analog converter means responsive to signals from said pulse responsive means for providing an output voltage level representative of said binary coded signals; and means responsive to said output voltage level from said converter means for providing a modified output voltage having a first rate of change with respect to said numerical representative signals for output voltage levels of a first voltage range and a second rate of change with respect to said numerical representative signals for output voltage levels of a second voltage range.

2. Apparatus according to claim 1 wherein:
said voltage level responsive means comprises means for generating a reference voltage representative of the signal level at which said first voltage range ends and said second voltage range begins; and means providing a first signal path for signals of said first voltage range and an additional path for signals of said second range.

3. Apparatus according to claim 2 wherein:
signals provided by said voltage level responsive means are provided at said first path and diminished in said additional path.

4. Apparatus according to claim 3 wherein:
said digital-to-analog converter means comprises a plurality of resistance elements having a commonly coupled electrode and resistance value of substantially two times the resistance of the preceeding resistance with the exception of the first resistance element which is set at a predetermined value.

* * * * *